United States Patent [19]

Anderson et al.

[11] Patent Number: 4,611,207

[45] Date of Patent: Sep. 9, 1986

[54] APPARATUS FOR MONITORING VOLTAGE ON A HIGH VOLTAGE OVERHEAD TRANSMISSION LINE

[75] Inventors: John G. Anderson, Schenectady, N.Y.; Howard R. Stillwell, Pittsfield, Mass.

[73] Assignee: Niagara Mohawk Power Corporation, Syracuse, N.Y.

[21] Appl. No.: 547,591

[22] Filed: Oct. 31, 1983

[51] Int. Cl.⁴ .................. G08B 21/00; G01R 31/02
[52] U.S. Cl. ....................... 340/870.16; 324/61 R; 324/72; 324/126
[58] Field of Search .............. 324/72, 725, 126, 61 R, 324/133, 119; 340/310 R, 87.37, 870.28, 870.16; 323/358, 364

[56] References Cited

U.S. PATENT DOCUMENTS

| | | | |
|---|---|---|---|
| 3,396,339 | 8/1968 | Miram | 324/126 |
| 3,524,133 | 8/1970 | Arndt | 324/126 |
| 3,546,587 | 12/1970 | Turecek | 324/72 |
| 3,657,650 | 4/1972 | Arndt | 324/126 |
| 3,684,955 | 8/1972 | Adams | 324/72 |
| 3,932,810 | 1/1976 | Kohler | 324/126 |
| 3,939,412 | 2/1976 | Hermstein | 324/72 |
| 3,969,671 | 7/1976 | Smith | 324/119 |
| 3,988,684 | 10/1976 | Müller | 324/126 |
| 4,052,665 | 10/1977 | Gruenwald | 324/126 |
| 4,090,130 | 5/1978 | Willenbecher | 324/126 |
| 4,121,154 | 10/1978 | Keating | 324/126 |
| 4,204,152 | 5/1980 | Imrie | 324/126 |
| 4,241,373 | 12/1980 | Mara | 324/126 |
| 4,320,337 | 3/1982 | Hartmann | 234/72 |
| 4,384,289 | 5/1983 | Stillwell | 340/870.17 |
| 4,435,681 | 3/1984 | Masuda | 324/72 |
| 4,520,318 | 5/1985 | Hascal | 324/72 |

Primary Examiner—John W. Caldwell, Sr.
Assistant Examiner—Michael F. Heim
Attorney, Agent, or Firm—Lalos, Keegan & Kaye

[57] ABSTRACT

A toroidal shaped metallic housing, mounted on and electrically connected with a high voltage transmission line, is adapted with a metal plate and an intervening dielectric sheet adhered to its exterior surface. The housing, tied to the transmission line voltage, and the metal plate constitute the electrodes of a first capacitor of a capacitive voltage divider, while the capacitive coupling of the metallic plate with the surrounding environment provides a second voltage divider capacitor. The voltage appearing on the plate is processed by circuitry within the housing to derive a signal indicative of the transmission line voltage.

2 Claims, 2 Drawing Figures

4,611,207

APPARATUS FOR MONITORING VOLTAGE ON A HIGH VOLTAGE OVERHEAD TRANSMISSION LINE

BACKGROUND OF THE INVENTION

The present invention relates to voltage measuring devices and particularly to apparatus for monitoring the voltage on an AC high voltage overhead transmission line.

In commonly assigned U.S. Pat. No. 4,384,289 there is disclosed a transponder unit which can be clamped at any point on an AC high voltage overhead transmission line for the purpose of generating real time data indicative of the line's temperature and the current flowing through it. This data is extremely useful to utilities in protecting the lines from protracted overloading and thus to insure long conductor life. Often it is not the generating plant but the size and type of transmission line conductors linking the plant to the substation that limit the amount of power that can be delivered without jeopardizing conductor life.

While transmission line temperature and current readings provide important information, it would be quite desirable to also know the transmission line voltage at the same monitoring point. From instantaneous current and voltage readings, the power being delivered over the transmission line can be ascertained. Once these three factors are known, the power factor can be determined. Since utilities are in the business of selling power, a continuous reading of the amount of power being dispatched over a transmission line provides highly useful information.

It is accordingly an object of the present invention to provide apparatus for continuously monitoring the voltage at any desired point along an aerial H.V. transmission line.

A further object is to provide transmission line voltage monitoring apparatus of the above-character which is simple in construction, easy to implement, and accurate and reliable in operation.

Other objects of the invention will, in part, be obvious and, in part, appear hereinafter.

SUMMARY OF THE INVENTION

In accordance with the present invention, there is provided a toroidal shaped housing which is adapted to be clamped on a H.V. aerial transmission line at any desired point along its length. The housing is metallic and tied to the transmission line potential. Adhered to the exterior surface of the housing is a dielectric sheet and over that a metallic plate which cooperates with the housing to provide the electrodes of a first capacitor. The capacitive coupling of the plate with the surrounding environment then provides a second capacitor of a capacitive voltage divider. An electrical connection with the metallic plate is brought into the interior of the housing where processing circuitry is situated to respond to the plate voltage and develop a signal indicative of the transmission line voltage. This signal is then transmitted by UHF radio telemetry to a ground station along with any other data developed by sensors accommodated by the housing.

The invention accordingly comprises the features of construction, combination of elements and arrangement of parts which will be exemplified in the construction hereinafter set forth, and the scope of the invention will be indicated in the claims.

BRIEF DESCRIPTION OF THE DRAWINGS

For a better understanding of the nature and objects of the present invention, reference should be had to the following detailed description taken in conjunction with the accompanying drawing, in which.

Corresponding reference numerals refer to like parts throughout the several views of the drawing.

DETAILED DESCRIPTION

Figure 1:
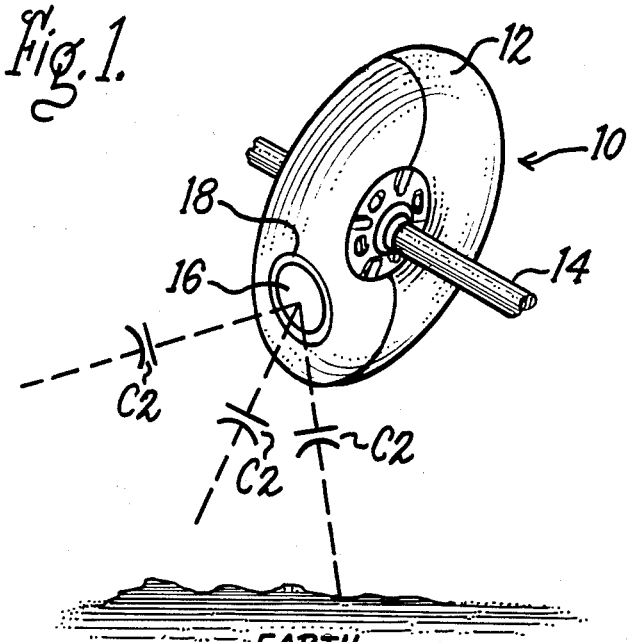
FIG. 1 is a perspective view of a transponder unit adapted to a H.V. aerial transmission line and equipped with the present invention.

The voltage monitoring apparatus of the present invention is shown in FIG. 1 being adapted to transponder unit, generally indicated at 10, which may be constructed in the manner shown in the above-noted U.S. Pat. No. 4,384,289. As disclosed therein, the transponder unit includes a toroidal shaped, metallic housing, 12, formed in two semi-annular sections or halves interconnected by a hinge mechanism. The transponder unit is manipulated to an open condition preferably through the facility of an elongated, insulated lineman's tool or "hot stick" to admit a transmission line 14 into the relatively open central region of the housing and then manipulated to a closed position clamping the transponder unit onto the transmission line. The mounting and dismounting of the transponder unit may be done while the transmission line is live.

Figure 2:
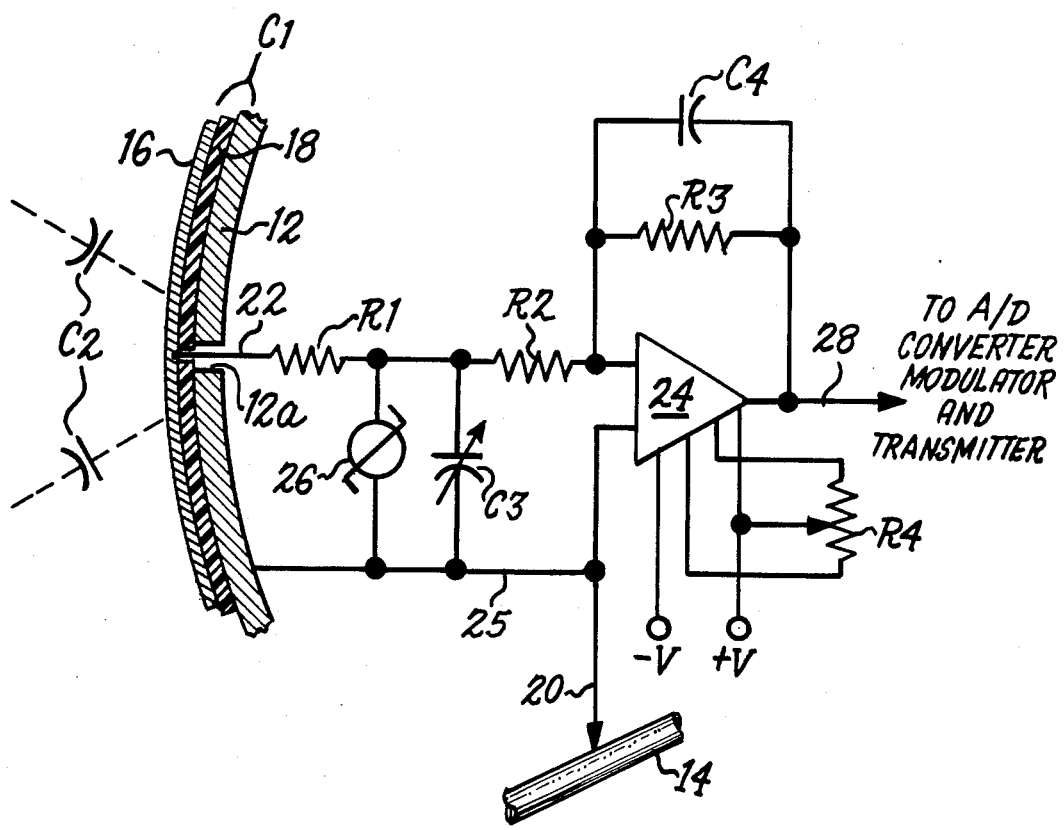
FIG. 2 is a circuit schematic diagram of the invention.

In addition to monitoring conductor temperature and transmission line current, as disclosed in U.S. Pat. No. 4,384,289, the transponder unit is, in accordance with the present invention, equipped to monitor the voltage on the transmission line. To this end, a thin metallic plate 16, which may be in the form of a circular patch (as shown), an elongated strip, or an elongated band, is bonded to the housing 12 with a thin dielectric sheet 18 sandwiched therebetween, all as best seen in FIG. 2. Plate 16 and housing 12 thus provide the electrodes of a capacitor C1, with the housing, incident to its being clamped onto transmission line 14, assuming the potential of the line voltage by virtue of a conductive probe 20 contacting the transmission line, as shown diagrammatically in FIG. 2. The capacitive coupling of plate 16 with the surrounding environment, which includes other adjacent transmission lines, the earth beneath transmission line 14, and any nearby structures, trees, etc., constitutes a second capacitor, indicated collectively as C2 in FIGS. 1 and 2.

It will be noted that these capacitors C1 and C2 are arranged as a capacitive voltage divider connected from the line voltage to essentially ground potential. The junction between the capacitors of this divider, plate 16, is connected by a lead 22 admitted through a small opening 12a to the interior of housing 12. The voltage appearing on plate 16 is applied by this lead to one input of an operational amplifier 24 through resistors R1 and R2. The other input to this operational amplifier is the line voltage delivered by probe 20, which, as previously mentioned, is also connected with housing 12 via lead 25. A varistor 26 is connected from the junction of resistors R1 and R2 to lead 25 to cooperate with the former resistor in suppressing transients. A variable trimming capacitor C3 is connected in parallel with varistor 26. The operational amplifier is provided with conventional feedback including the parallel combination of a resistor R3 and capacitor C4. Resistor R4 is connected with the operational amplifier to function as a zeroing adjustment. A power supply (not shown) powered from the line voltage derives operating voltages +V and −V for the amplifier 24.

The output of the operational amplifier, appearing on lead 28, is fed as a voltage signal to an analog to digital converter, modulator and transmitter for transmission to a ground station in the same manner as disclosed for the temperature and current data signals in the above-noted U.S. Pat. No. 4,384,289. The received voltage signal is processed to introduce a calibration factor, which may be either mathematically derived or initially determined for a particular installation by measuring the actual line voltage by traditional techniques, to achieve an ultimate voltage signal which has a known proportional relationship with the transmission line voltage. This ultimate voltage signal may then be multiplied by the received current signal and integrated to determine the real power being dispatched over the transmission line. The real power value or wattage may then be divided into the volt-ampere product to obtain the power factor.

It will thus be seen that the objects set forth above, including those made apparent from the preceding description are efficiently attained and, since certain changes may be made in the above description without departing from the scope of the invention, it is intended that all matter contained in the above description or shown in the accompanying drawing shall be interpreted as illustrative and not in a limiting sense.

Having described our invention, what we claim as new and desire to secure by Letters Patent is:

1. Apparatus for monitoring voltage on a high voltage aerial transmission line comprising, in combination:
   A. an electrically conductive housing removably mounted on a high voltage aerial transmission line;
   B. means electrically connecting said housing to the transmission line whereby said housing said housing assumes the electrical potential of the transmission line;
   C. a dielectric sheet adhered to the exterior surface of said housing;
   D. a metallic plate adhered in overlying relation to the exposed surface of said sheet, whereby said housing and said plate constitute the electrodes of a first capacitor and the capacitive coupling of said plate with the surrounding environment constitutes a second capacitor connected with said first capacitor as a capacitive voltage divider;
   E. circuitry situated within said housing responsive to the voltage appearing on said plate for developing an ouput signal indicative of the transmission line voltage; and
   F. a lead connected with said plate and admitted through an opening in said housing for connection with said circuitry situated within said housing.

2. The apparatus defined in claim 1, wherein said housing is toroidal shaped comprising two semi-annular housing sections embracing the transmission line.

* * * * *

UNITED STATES PATENT AND TRADEMARK OFFICE
CERTIFICATE OF CORRECTION

PATENT NO. : 4,611,207

DATED : September 9, 1986

INVENTOR(S) : John G. Anderson, Howard R. Stillwell

It is certified that error appears in the above-identified patent and that said Letters Patent is hereby corrected as shown below:

In Claim 1, line 6, "said housing" (second instance) should be deleted.

Signed and Sealed this

Fourth Day of November, 1986

[SEAL]

*Attest:*

DONALD J. QUIGG

*Attesting Officer*   *Commissioner of Patents and Trademarks*